United States Patent [19]
McKee

[11] Patent Number: 5,084,126
[45] Date of Patent: Jan. 28, 1992

[54] METHOD AND APPARATUS FOR UNIFORM FLOW DISTRIBUTION IN PLASMA REACTORS

[75] Inventor: Jeffrey A. McKee, Dallas, Tex.

[73] Assignee: Texas Instruments Incorporated, Dallas, Tex.

[21] Appl. No.: 291,719

[22] Filed: Dec. 29, 1988

[51] Int. Cl.⁵ ............................................. H01L 21/00
[52] U.S. Cl. .................... 156/345; 118/723; 204/164
[58] Field of Search .......................... 156/345; 118/723; 204/164

[56] References Cited

U.S. PATENT DOCUMENTS

| | | | |
|---|---|---|---|
| 4,401,054 | 4/1981 | Matsuo et al. | 118/723 |
| 4,615,756 | 10/1986 | Tsujii et al. | 156/345 |
| 4,664,747 | 5/1987 | Sekiguchi et al. | 156/345 |
| 4,689,112 | 8/1987 | Bersin | 156/345 |
| 4,898,118 | 2/1990 | Murakami et al. | 118/723 |

OTHER PUBLICATIONS

IBM Technical Disclosure; "Method of Preparing Hydrogenated Amorphous Silicon"; vol. 22 No. 8A-1/1/80.

*Primary Examiner*—Richard Bueker
*Assistant Examiner*—George Goudreau
*Attorney, Agent, or Firm*—James C. Kesterson; James T. Comfort; Melvin Sharp

[57] ABSTRACT

A plasma flow is uniformly distributed over the surface of a water (76) by an L-shaped tube (64) and a distribution ring (62). A dispersal gas, which may either comprise an inert gas or a gas that cooperates with the reactive species of the plasma, is sprayed from the tube (64) and the ring (62) into the flow of the plasma. The ring (62) comprises a hollow tube encircling the outlet of a plasma reactor. A gas is circulated through the ring (62) within the hollow interior (66) and is emitted therefrom by nozzles (70). The tube (64) comprises a quartz or anodized aluminum L-shaped tube which is positioned directly in the flow of the plasma. The gas is emitted from the tube (64) in a direction directly opposite and into the flow of the plasma.

25 Claims, 1 Drawing Sheet

METHOD AND APPARATUS FOR UNIFORM FLOW DISTRIBUTION IN PLASMA REACTORS

TECHNICAL FIELD OF THE INVENTION

This invention relates in general to semiconductor processing devices, and in particular to a method and apparatus for providing a uniform flow distribution in plasma reactors.

BACKGROUND OF THE INVENTION

Semiconductor processing typically requires several stages of surface etching and layer depositing to form circuits thereon. One device used to perform such etching and depositing is known as a microwave-induced plasma remote processor. With a remote processor, a metallic box is placed around a quartz tube or waveguide, and microwaves are generated therethrough by a magnetron. A gas is pumped into the quartz tube and excited into a plasma state therein by the microwaves.

The plasma is then directed from an outlet of the reactor to the surface of the semiconductor wafer being processed. The flow of the plasma from the outlet of the reactor to the semiconductor wafer tends to be nonuniform since there is no device to directionalize or distribute the plasma. Due to this nonuniformity, various portions of the wafer may be etched or deposited at different rates which can create defective circuitry.

One device typically used to attempt to provide a uniform flow distribution of the plasma from the reactor to the wafer is a disk placed there between. The disk may have holes passing there through to assist in the distribution of the plasma to the wafer. Unfortunately, the disk is also an object blocking the path of the radicals needed to process the wafer.

Thus, with the use of such a disk, some of the radicals may lose their reactivity and therefore be unable to process the wafer. Additionally, the disk material may act as a source of contamination to the processing of the wafer. Since the disk is positioned in the path of the plasma, portions of the disk may be etched by the plasma and redeposited on the wafer, thus contaminating the disk. Thus, there is a need for a method and apparatus for providing a uniform flow distribution in plasma reactors, without interfering with the plasma or causing undesirable contamination of the wafer being processed.

SUMMARY OF THE INVENTION

The present invention disclosed herein comprises a method and apparatus for providing uniform flow distribution in a downstream remote plasma processor which substantially eliminates or reduces problems associated with prior flow distribution techniques. The present invention allows the even distribution of plasma over the surface of a semiconductor wafer without consuming reactive elements of the plasma and without contaminating the wafer.

In accordance with one aspect of the present invention, an apparatus provides a uniform flow distribution of plasma to a semiconductor wafer. The apparatus comprises a gas and a gas dispersal unit. The gas disperal unit directs the gas into the flow of the plasma to uniformly distribute the plasma to the wafer being processed. The gas may comprise either a reactive species corresponding to the plasma or an inert gas such as argon, nitrogen or helium.

In accordance with another aspect of the invention, the gas dispersal unit comprises a generally hollow container, which is positioned adjacent to the flow of the plasma. Holes are formed through the container to allow the gas to be expelled into the flow of the plasma. Nozzles may be placed over the holes to direct the gas into the plasma as desired.

In another aspect of the present invention, the dispersal unit may comprise a tube positioned to allow expulsion of the gas directly opposite but into the flow of the plasma. A combination of the direct flow gas tube may be used with the adjacent tube to provide flow control.

It is a technical advantage of the present invention that plasma may be uniformly distributed to the surface of a wafer being processed. It is a further technical advantage of the present invention that the unform flow distribution is not contaminated with particles from a device placed in the path thereof. It is a still further technical advantage of the present invention that the flow control apparatus does not hamper the activity of the reactive species.

BRIEF DESCRIPTION OF THE DRAWINGS

For a more complete understanding of the present invention and for further advantages thereof, reference is now made to the following Detailed Description, taken in conjunction with the accompanying Drawings, in which:

FIG. 2b is a cross-sectional view of the apparatus of FIG. 2a;

DETAILED DESCRIPTION OF THE INVENTION

Figure 1:
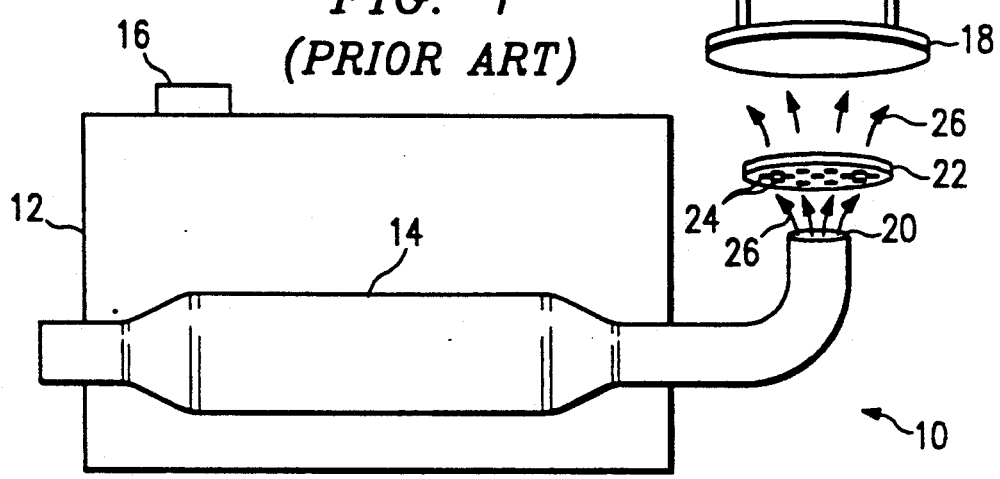
FIG. 1 is a cross-sectional view of a downstream remote plasma processor and a flow distribution disk in accordance with the prior art.

Referring to FIG. 1, a downstream remote plasma reactor constructed in accordance with the prior art is generally identified by the reference numeral 10. The reactor 10 comprises a metallic container 12 with a quartz waveguide 14 passing therethrough. A magnetron 16, which is secured to the container 12, generates microwaves to provide energy to excite a reactive species into plasma within the waveguide 14. A cooling fluid (such as air) may be circulated through the container 12 to cool the waveguide 14. A semiconductor wafer 18, positioned proximate an outlet 20 of the waveguide 14, is processed by the plasma formed within the waveguide 14.

A deflection disk 22 is placed between the wafer 18 and the outlet 20 to attempt to distribute the flow of the plasma from the outlet 20 to the wafer 18. The deflection disk 22 may have a plurality of apertures 24 passing therethrough to allow the plasma to pass therethrough. The purpose of the disk 22 is to evenly distribute plasma, as indicated by arrows 26, over the surface of the wafer 18 during processing thereof.

Unfortunately, due to the positioning of the disk 22, plasma, upon striking the disk 22, tends to etch particles therefrom. Removal of particles from the disk 22 by etching allows the particles to be redeposited onto the surface of the wafer 18, which will contaminate the surface. Additionally, the disk 22 tends to reduce the ion activity of the plasma, causing radicals to recombine and lose their activity. Since the purpose of creating plasma is to form radicals to react with the surface of the wafer 18, any loss of the radicals is a loss to the efficiency of the system processing the wafer.

Figure 2A:
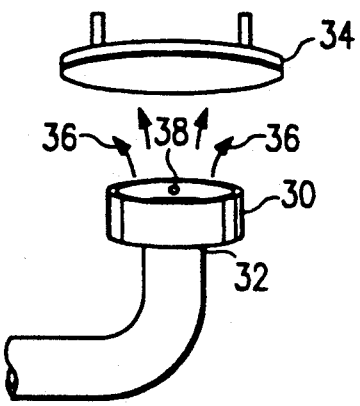
FIG. 2a is a perspective view of an embodiment of an apparatus constructed in accordance with the present invention.
Figure 2B:
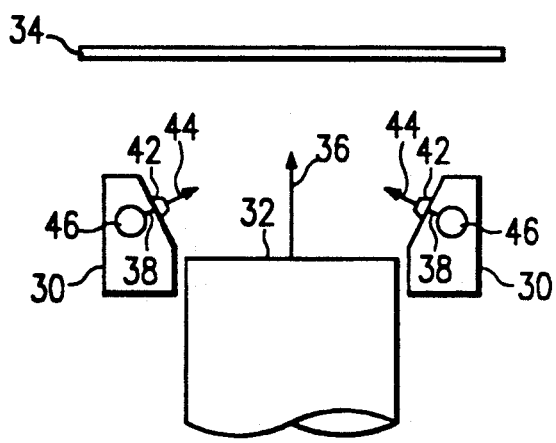

Referring to FIGS. 2a and 2b, a first embodiment construction in accordance with the present invention is illustrated. Shown in perspective in FIG. 2a, a sprayer distribution ring 30 is positioned between a waveguide outlet 32 and a wafer 34. The distribution ring 30 is positioned around outlet 32 to allow a gas (not shown) to be directed from the ring 30 into a flow of plasma, which is indicated by arrows 36. The ring 30 is provided with a plurality of openings 38 (only one of which is shown) from which the gas is directed.

The ring 30 has an advantage over the prior art by being out of the direct path of the plasma 36 and is, therefore, not likely to provide contaminates to the wafer 34. Thus the ring 30 may be formed from any suitable material such as stainless steel, anodized aluminum, plastic, quartz, fluorocarbons and etc. Additionally, the ring 30 is not likely to hinder the ion activity of the plasma, which would reduce the effectiveness of the plasma. As a result of the distribution ring 30, the plasma 36 is evenly distributed across the surface of the wafer 34.

Referring to FIG. 2b, the distribution ring 30 is illustrated in cross-sectional view. The distribution ring 30 may be fitted with adjustable nozzles 42 over the openings 38 to allow the gas, as indicated by arrows 44, to be directed into the plasma 36.

The distribution ring 30 has a hollow central passageway 46 to allow circulation of the gas 44 within the ring 30 from a pressurized external source (not shown). As the gas 44 enters the passageway 46, it flows into the openings 38 and is expelled through the nozzles 42. The gas interacts with the plasma 36 to disturb the normal path of the plasma and to evenly distribute the plasma over the face of the wafer 34. The gas 44 preferably comprises a gas that corresponds to the plasma 36 or an inert gas such as argon, nitrogen or helium. If a corresponding gas is used, the gas may contribute to the processing of the wafer 34 by supplying additional radicals to the plasma 36.

The nozzles 42 may be repositioned by conventional swivel or ball-in-socket devices to redirect the flow of gas 44 in order to provide optimum distribution of the plasma 36. Additionally, the nozzles 42 may be positioned in an "on" or "off" setting to allow for a multiplicity of flow distribution patterns.

Figure 3:
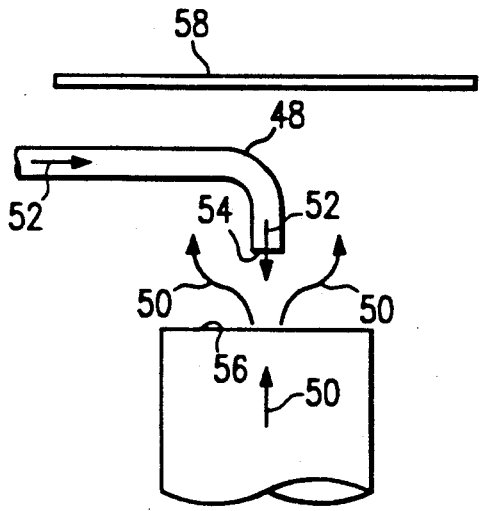
FIG. 3 is a cross-sectional view of an alternative embodiment constructed in accordance with the present invention.

Referring to FIG. 3, a second embodiment constructed in accordance with the present invention is illustrated. An L-shaped sprayer tube 48 is positioned in the plasma flow, which is indicated by arrows 50. A gas, as indicated by arrows 52, is thus allowed to directly strike the plasma flow 50. An open end 54 of the tube 48 is positioned directly over the waveguide outlet 56 to allow the gas 52 to alter and distribute the plasma flow 50 as it exits outlet 56. The redistributed plasma is thus evenly distributed over the surface of wafer 58. Although not shown, it is to be understood that open end 54 of the L-shaped tube 48 may be fitted with a movable nozzle to allow adjustment of the flow of the gas 52.

The gas 52 may comprise either a gas similar to the reactive species used in the plasma flow 50 or an inert gas such as argon, nitrogen or helium. The distribution of the plasma flow 50 is adjusted around the L-shaped tube 48 to minimize any loss of radicals caused by striking the tube 48. By adjusting the flow around the L-shaped tube 48, the possibility of portions of tube 48 being etched by the plasma flow 50 and redepositing on a wafer 58 is lessened. The L-shaped tube 48 may comprise any suitable material such as, for example, quartz or anodized aluminum.

Figure 4:
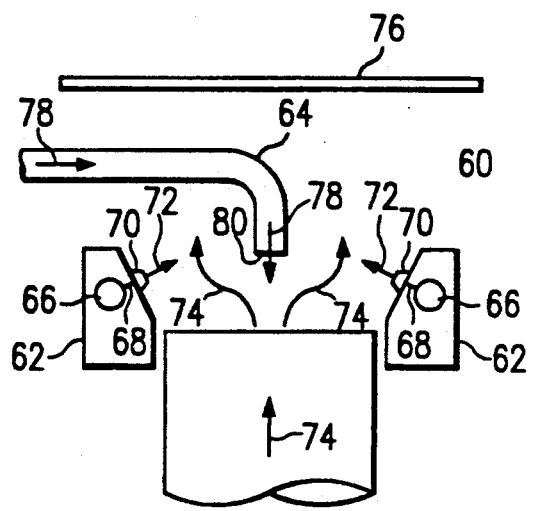
FIG. 4 is a cross-sectional view of an apparatus constructed in accordance with the preferred embodiment of the present invention.

Referring to FIG. 4, an apparatus constructed in accordance with the preferred embodiment of the present invention is generally identified by the reference numeral 60. The apparatus 60 utilizes aspects of both embodiments shown in FIGS. 2 and 3 and comprises a distribution ring 62 and a generally L-shaped tube 64. The distribution ring 62 has a hollow interior 66 with an outlet passageway 68 leading to a nozzle 70. As a gas enters the passageway 66 of the ring 62 from a pressurized apparatus (not shown), the gas is forced through passageway 68 and out nozzle 70 as indicated by arrows 72. The gas 72 strikes a plasma flow, as indicated by arrows 74, to distribute the plasma 74 evenly over a surface of a wafer 76.

Simultaneously, another gas as indicated by arrows 78 is forced through an open end 80 of the generally L-shaped tube 64 directly opposite and into the plasma flow 74. Through the combined effects of the gas 72 and the gas 78, the plasma flow 74 is evenly distributed over the surface of the wafer 76. Gases 72 and 78 may comprise the same gas, in some environments it may be desirable to provide different compositions to the two gases.

The present invention thus greatly reduces the disadvantages of the prior art. The present invention allows even distribution of the flow of plasma from the outlet of the reactor to the surface of the wafer being processed. The distribution ring and/or the L-shaped tube contribute rather than hamper the processing. Since the present invention does not impinge upon the activity of the plasma nor act as a source of contaminants to the wafer, the advantages of the present invention are clear.

Although the present invention has been described with respect to a preferred embodiment thereof, various changes and modifications may be suggested to one skilled in the art, and it is intended that the present invention encompass such changes and modifications as fall within the scope of the appended claims.

What is claimed is:

1. An apparatus for providing uniform flow distribution of plasma to a semiconductor wafer, comprising:
   a gas;
   a gas dispersal unit positioned adjacent the flow of the plasma, said unit defining hole for expulsion of said gas; and
   adjustable nozzles attached over said holes for directing said gas into the plasma to uniformly distribute flow of the plasma to the wafer.

2. The apparatus of claim 1, wherein said gas dispersal unit comprises a ring surrounding the flow of the plasma.

3. The apparatus of claim 2, wherein said ring comprises anodized aluminum.

4. The apparatus of claim 2, wherein said ring comprises stainless steel.

5. An apparatus for providing uniform flow distribution of plasma to a semiconductor wafer comprising:
a gas; and
a tube positioned directly in the flow of the plasma to allow expulsion of said gas in a direction opposite and into the flow of the plasma.

6. The apparatus of claim 5, wherein said tube comprises a generally L-shaped tube.

7. The apparatus of claim 5, wherein said tube comprises quartz.

8. The apparatus of claim 5, wherein said tube comprises anodized aluminum.

9. An apparatus for providing uniform flow distribution of plasma to a semiconductor wafer comprising:
a gas;
a tube positioned directly in the flow of the plasma to allow expulsion of a first said gas in a direction directly opposite and into the flow the plasma; and
a generally hollow container positioned around the flow the plasma, said container having holes therethrough for expulsion of a second said gas into the plasma.

10. The apparatus of claim 1, wherein said gas comprises a reactive species corresponding to the plasma.

11. The apparatus of claim 1, wherein said gas comprises an inert gas.

12. The apparatus of claim 11, wherein said inert gas comprises argon.

13. The apparatus of claim 11, wherein said inert gas comprises nitrogen.

14. The apparatus of claim 11, wherein said inert gas comprises helium.

15. An apparatus for providing even flow distribution of plasma to process a semiconductor wafer in a downstream remote reactor, comprising:

a supply of dispersal gas;
a sprayer positioned adjacent an outlet of the reactor, said sprayer defining apertures to emit said gas; and
adjustable nozzles over said apertures to direct said gas into the flow of the plasma to uniformly distribute the flow of the plasma to the wafer.

16. The apparatus of claim 15, wherein said sprayer comprises a jet arranged to emit said gas in a direction directly opposite and into the flow of the plasma.

17. The apparatus of claim 16, wherein said jet comprises a generally L-shaped tube.

18. The apparatus of claim 17, wherein said L-shaped tube comprises quartz.

19. The apparatus of claim 17, wherein said L-shaped tube comprises anodized aluminum.

20. The apparatus of claim 15, wherein said sprayer comprises:
a jet arranged to emit a first said gas in a direction directly opposite and into the flow of the plasma;
a tube positioned around an outlet of the reactor, said tube having apertures formed therein to emit a second said gas; and
adjustable nozzles over said apertures to direct said second gas into the flow of the plasma.

21. The apparatus of claim 15, wherein said gas comprises a reactive species corresponding to the plasma.

22. The apparatus of claim 15, wherein said gas comprises an inert gas.

23. The apparatus of claim 22, wherein said inert gas comprises argon.

24. The apparatus of claim 22, wherein said inert gas comprises nitrogen.

25. The apparatus of claim 22, wherein said inert gas comprises helium.

* * * * *